United States Patent
Hsu et al.

(10) Patent No.: US 11,139,239 B2
(45) Date of Patent: Oct. 5, 2021

(54) RECESSED INDUCTOR STRUCTURE TO REDUCE STEP HEIGHT

(71) Applicant: Taiwan Semiconductor Manufacturing Co., Ltd., Hsin-Chu (TW)

(72) Inventors: Hung-Wen Hsu, Tainan (TW); Jiech-Fun Lu, Madou Township (TW); Kai Tzeng, Neipu Township (TW); Wei-Li Huang, Pingtung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 66 days.

(21) Appl. No.: 16/589,395

(22) Filed: Oct. 1, 2019

(65) Prior Publication Data

US 2021/0098371 A1    Apr. 1, 2021

(51) Int. Cl.
  *H01L 23/522* (2006.01)
  *H01L 49/02* (2006.01)
  *H01L 21/768* (2006.01)
  *H01L 23/532* (2006.01)
  *H01L 23/528* (2006.01)

(52) U.S. Cl.
  CPC .... *H01L 23/5227* (2013.01); *H01L 21/76816* (2013.01); *H01L 21/76871* (2013.01); *H01L 23/5283* (2013.01); *H01L 23/53266* (2013.01); *H01L 28/10* (2013.01)

(58) Field of Classification Search
  CPC ............. H01L 23/5227; H01L 23/5283; H01L 21/76871; H01L 21/76816; H01L 23/53266; H01L 28/10
  See application file for complete search history.

(56) References Cited

U.S. PATENT DOCUMENTS 6,037,649 A    3/2000 Liou
2003/0013264 A1    1/2003 Yeo et al.
(Continued)

OTHER PUBLICATIONS

Silvaco. Questex11.in: Comparing One Turn and Straight Line Inductors. Date of publication is unknown. Retrieved online on Nov. 16, 2017 from https://www.silvaco.com/examples/quest/section1/example12/index.html.
(Continued)

*Primary Examiner* — Karen Kusumakar
*Assistant Examiner* — Adam S Bowen
(74) *Attorney, Agent, or Firm* — Eschweiler & Potashnik, LLC

(57) ABSTRACT

Various embodiments of the present disclosure are directed towards an integrated circuit (IC) including an interconnect structure overlying a substrate. The interconnect structure has a plurality of metal layers overlying over the substrate. A first dielectric layer overlies an uppermost surface of the interconnect structure. The first dielectric layer has opposing sidewalls defining a trench. A first magnetic layer is disposed within the trench and conformally extends along the opposing sidewalls. Conductive wires are disposed within the trench and overlie the first magnetic layer. A second magnetic layer overlies the first magnetic layer and the conductive wires. The second magnetic layer laterally extends from over a first sidewall of the opposing sidewalls to a second sidewall of the opposing sidewalls.

20 Claims, 8 Drawing Sheets

(56) References Cited

U.S. PATENT DOCUMENTS

| | | |
|---|---|---|
| 2007/0268105 A1 | 11/2007 | Walls |
| 2008/0061420 A1 | 3/2008 | Degani et al. |
| 2008/0204183 A1 | 8/2008 | Loza |
| 2011/0108941 A1 | 5/2011 | Guzek et al. |
| 2012/0268229 A1 | 10/2012 | Yen et al. |
| 2014/0011324 A1 | 1/2014 | Liu et al. |
| 2015/0302975 A1 | 10/2015 | Qi et al. |
| 2016/0149122 A1* | 5/2016 | Sullivan .................. H01L 43/12 438/3 |
| 2016/0268336 A1* | 9/2016 | Shum ...................... H01L 43/12 |

OTHER PUBLICATIONS

U.S. Appl. No. 15/793,127, filed Oct. 25, 2017.
Non-Final Office Action dated Apr. 18, 2019 for U.S. Appl. No. 15/793,127.
Notice of Allowance dated Jul. 31, 2019 in connection with U.S. Appl. No. 15/793,127.
Notice of Allowance dated Jul. 10, 2019 in connection with U.S. Appl. No. 16/106,525.
U.S. Appl. No. 16/106,525, filed Oct. 25, 2017.

\* cited by examiner

RECESSED INDUCTOR STRUCTURE TO REDUCE STEP HEIGHT

BACKGROUND

An integrated circuit (IC) is an assembly of electronic components on a single piece of semiconductor material. A widely used electronic component in an IC is an inductor. An inductor is a passive element that stores electrical energy in a magnetic field when electric current flows through the inductor. Because any conductor of electrical current has inductive properties, inductors vary greatly in their design. Inductors are versatile devices that may be used in, among other things, resistor-inductor (RL) filters, inductor-capacitor (LC) circuits, resistor-inductor-capacitor (RLC) circuits, power supplies, transformers, and many other circuit components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
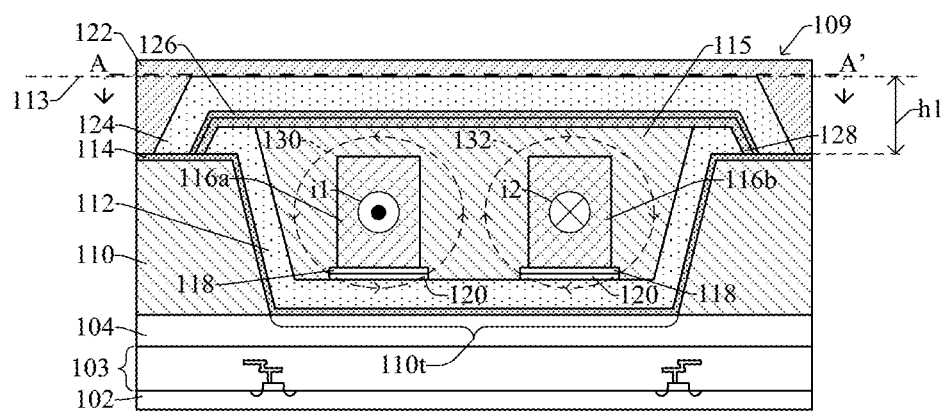
FIG. 1 illustrates a cross-sectional view of some embodiments of an in integrated circuit (IC) including an inductor structure recessed into a first dielectric layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element, but rather are merely generic identifiers. For example, "a first dielectric layer" described in connection with a first figure may not necessarily correspond to a "first dielectric layer" described in connection with some embodiments, but rather may correspond to a "second dielectric layer" in other embodiments.

Some inductors are integrated monolithically on a semiconductor substrate. In some embodiments, integrated inductors are formed within back-end-of-the-line (BEOL) metal interconnect layers over a substrate. Because any conductor of electrical current has inductive properties, integrated inductors are implemented in a variety of layouts, for example, spiral inductors, planar spiral inductors, straight line inductors, or coupled inductors. Moreover, depending on the application, an integrated inductor may comprise, for example, a dielectric material core (e.g., an air core), a ferromagnetic core, or a ferrimagnetic core. For example, an integrated spiral inductor may comprise a magnetic core arranged within a first metal layer. A metal wire may wind around the magnetic core in a helical pattern, such that the metal wire has multiple turns that continuously extend around the magnetic core.

A challenge with the above inductors is providing customers with an inductor that precisely fits their needs. Customers often design integrated circuits (ICs) requiring an inductor. These ICs are designed to run at a specific inductance. Typically, the manufacturer of the IC implements the inductor into the customer's IC. However, because each specific IC application requires a specific inductance to run optimally, manufactures typically implement a pre-designed inductor having a specific inductance. This pre-designed inductor may have an inductance that is a fixed value, which may be greater/less than required for the customer's IC. This difference in inductance may increase the overall resistance of the customer's IC and cause the customer's IC to run at a less than optimal state. A partial solution to this challenge is to design IC specific inductors that may provide variable inductance options when an inductor is desired for an IC.

In some embodiments, the IC specific inductor overlies an etch stop layer that overlies a passivation layer. The passivation layer overlies an interconnect structure. The IC specific inductor includes two conductive wires extending in parallel with one another along an upper surface of the etch stop layer, where the upper surface of the etch stop layer is substantially flat. A magnetic shielding structure continuously wraps around at least a middle segment of the two conductive wires and is separated from the two conductive wires by a dielectric structure. The dielectric structure insulates the two conductive wires from one another and has an upper surface with a semi-circular shape. The magnetic shielding structure includes a first magnetic layer under a second magnetic layer. The first magnetic layer is disposed between the etch stop layer and the conductive wires, and the second magnetic layer conforms to the semi-circular shape of the dielectric structure. Therefore, a top surface of the second magnetic layer is vertically offset from the upper surface of the etch stop layer by a relatively large step height (e.g., greater than 35 micrometers).

Challenges with the above IC specific inductor are related to fabrication steps used to form the IC specific inductor and the relatively large step height. For example, during fabrication of the inductor, an upper etch stop layer is formed over the first magnetic layer. Due to a shape of the first magnetic layer (e.g., a trapezoidal-shape) and a short length of the sidewalls of the first magnetic layer, the upper etch stop layer may delaminate from the first magnetic layer. This may cause delamination in overlying structures and/or layers during subsequent processing steps, thereby leading to failure of the IC specific inductor. In another example, because the conductive wires overlie the top surface of the etch stop layer and the dielectric structure encloses the conductive wires, it may be difficult to control a thickness and shape of the dielectric structure (e.g., due to limitations of tools used to fabricate the IC). Thus, the dielectric structure and the second magnetic layer may have a semi-circular shape that results in the IC having an undulated upper surface, thereby creating the relatively large step height (e.g., greater than 35 micrometers). This may reduce an ability to bond bump structures of the IC (that overlie and are electrically coupled to the conductive wires) to an external device (e.g., an external IC). Further, this reduces a number of IC specific inductors that may be disposed over the interconnect structure and/or increases time, complexity, and costs associated with fabricating the IC specific inductors.

In some embodiments, the present disclosure relates to an IC inductor embedded in a dielectric structure, thereby mitigating problems related to the fabrication steps and reducing the step height (e.g., to less than 15 micrometers). A first dielectric layer overlies an interconnect structure. The etch stop layer overlies an upper surface of the first dielectric layer and lines a trench arranged within the first dielectric layer. A first magnetic layer also lines the trench over the etch stop layer and has a top surface extending over the top surface of the first dielectric layer. The conductive wires are disposed over an upper surface of the first magnetic layer within the trench, such that a top surface of the conductive wires is below the top surface of the first magnetic layer. A second dielectric layer surrounds the conductive wires and at least partially fills the trench. A second magnetic layer overlies the second dielectric layer and the first magnetic layer, such that a top surface of the second magnetic layer is substantially flat. The top surface of the second magnetic layer is vertically offset from the top surface of the etch stop layer by a relatively small step height (e.g., less than 15 micrometers). By forming at least a portion (e.g., the conductive wires and the first magnetic layer) of the IC inductor in the trench of the first dielectric layer, a shape and/or size of the IC inductor may be more easily controlled. Further, the step height of the IC inductor may be reduced. This, in part, increases control of the shape and size of the IC inductor and/or decreases time, complexity, and costs associated with fabricating the IC inductor.

FIG. 1 illustrates a cross-sectional view of some embodiments of an integrated circuit (IC) 100 including an inductor structure 109 recessed into a first dielectric layer 110.

The IC 100 includes an interconnect structure 103 overlying a substrate 102. The substrate 102 may include one or more semiconductor devices (e.g., transistor(s), resistor(s), diode(s), etc.) or portions of semiconductor devices. In some embodiments, the one or more semiconductor devices are disposed over/within the substrate 102 by a front-end-of-line (FEOL) process. For example, the semiconductor device may be a transistor comprising a gate stack (e.g., a metal gate disposed over a high-k dielectric) disposed over the substrate 102 and between source/drain regions disposed within the substrate 102.

In some embodiments, the interconnect structure 103 is formed by a back-end-of-line (BEOL) process. The interconnect structure 103 may comprise a plurality of conductive features, for example, conductive contacts, conductive lines, and/or conductive vias disposed within an inter-level dielectric (ILD) material. In some embodiments, the interconnect structure 103 may include a plurality of metal layers (e.g., metal layer 1, metal layer 2, etc.) disposed over one another. Each metal layer may comprise a conductive line, and a conductive via may connect a conductive line from a first metal layer to a conductive line of a second metal layer.

A passivation layer 104 overlies the interconnect structure 103. In some embodiments, the passivation layer 104 is formed by the BEOL process. The passivation layer 104 may conformally line an uppermost surface of the interconnect structure 103. In some embodiments, the passivation layer 104 has a substantially planar top surface. The passivation layer 104 may, for example, be or comprise silicon dioxide, silicon nitride, polyimide compounds, or other suitable materials. In some embodiments, some conductive lines connect a connective via to a contact pad (not shown) disposed within the passivation layer 104.

In some embodiments, the first dielectric layer 110 overlies the passivation layer 104 and has sidewalls that define a trench 110t. A first etch stop layer 114 overlies an upper surface of the first dielectric layer 110 and lines at least a portion of the trench 110t. Further, the first etch stop layer 114 extends along an upper surface of the passivation layer 104 and along sidewalls of the first dielectric layer 110. A first magnetic layer 112 overlies the first etch stop layer 114 and fills a portion of the trench 110t, wherein the first magnetic layer 112 conforms to sidewalls of the first dielectric layer 110 that define the trench 110t. In some embodiments, the first magnetic layer 112 may, for example, be or comprise a magnetic material, such as Cobalt Zirconium Tantalum (CZT), an iron-nickel (NiFe) compound, or other suitable magnetic material(s).

A first conductive wire 116a and a second conductive wire 116b are disposed within the trench 110t of the first dielectric layer 110 and overlie the first magnetic layer 112. In some embodiments, the first and second conductive wires 116a-b define an inductor unit with an inductive value. The first and second conductive wires 116a-b each comprise a conductive material, such as copper (Cu), aluminum (Al), gold (Au), silver (Ag), Al—Cu compounds, or any other suitable conductive material. In some embodiments, the first and second conductive wire 116a-b may be a post-passivation copper interconnect (e.g., formed after the BEOL process and/or after formation of the passivation layer 104).

In some embodiments, a barrier seed layer 118 overlies a first isolation layer 120, such that the barrier seed layer 118 and the first isolation layer 120 physically separate and electrically isolate the first and second conductive wires 116a-b from the first magnetic layer 112. A second dielectric layer 115 is disposed within the trench 110t and surrounds the first and second conductive wires 116a-b. In some embodiments, the second dielectric layer 115 is configured to electrically isolate the first and second conductive wires 116a-b from adjacent conductive layers and/or structures (e.g., the first magnetic layer 112). A second isolation layer 128 overlies the second dielectric layer 115 and the first magnetic layer 112. A second etch stop layer 126 overlies and lines an upper surface of the second isolation layer 128. A second magnetic layer 124 overlies the second etch stop layer 126 and extends laterally extends over the first magnetic layer 112. In some embodiments, the second magnetic layer 124 may, for example, be or comprise a magnetic material, such as Cobalt Zirconium Tantalum (CZT), an iron-nickel (NiFe) compound, or other suitable magnetic material(s). An upper dielectric layer 122 overlies the second magnetic layer 124. In some embodiments, the upper dielectric layer 122 has a substantially level upper surface. In some embodiments, the second magnetic layer 124 has a substantially flat upper surface and/or substantially flat top surface (e.g., a flat upper surface within a tolerance of a chemical mechanical planarization (CMP) process or within a tolerance of an etch process). For example, in some embodiments, at any point a height of the upper surface of the second magnetic layer 124 varies within a range of −50 Angstroms and +50 Angstroms from a level horizontal line 113 located between the substantially flat upper surface of the second magnetic layer 124 and a lower surface of the upper dielectric layer 122. In other embodiments, at any point a height of the upper surface of the second magnetic layer 124 varies within a range of −25 Angstroms and +25 Angstroms from the level horizontal line 113. In yet other embodiments, at any point a height of the upper dielectric layer 122 varies within a range of approximately +10% and −10% of a thickness of the upper dielectric layer 122 from the level horizontal line 113.

During operation of the inductor structure 109, in some embodiments, as a first current i1 passes through the first conductive wire 116a, the first conductive wire 116a induces a first magnetic field 130. As a second current i2 passes through the second conductive wire 116b, the second conductive wire 116b induces a second magnetic field 132. Depending on the direction of current flow of the first and/or second currents i1, i2, the first and/or second magnetic fields 130, 132 will be induced based on the "right-hand rule". For example, in some embodiments, a circuit is configured to provide a first current i1 through the first conductive wire 116a so that the first current i1 flows out of the page (depicted by a black dot surrounded by a circle), and provides a second current i2 through the second conductive wire 116b so that the second current i2 flows into the page (depicted by an X surrounded by a circle). Thus, a first magnetic field 130 is induced around the first conductive wire 116a, and a second magnetic field 132 is induced around the second conductive wire 116b. Thus, the inductor structure 109 has a measurable inductance. In some embodiments, the first and second magnetic layers 112, 124 shield the first and second magnetic fields 130, 132 to concentrate the magnetic flux of the inductor structure 109 near the first and second conductive wires 116a-b.

By virtue of the first and second conductive wires 116a-b being disposed within the trench 110t, the substantially flat upper surface of the second magnetic layer 124 is vertically offset from the top surface of the first etch stop layer 114 by a step height h1. This facilitates easy design and fabrication of the shape and size of the second dielectric layer 115 and the second magnetic layer 124, thereby decreasing time and costs associated with forming the IC 100. Because the first magnetic layer 112 lines the trench 110t, the delamination of the first magnetic layer 112 from the second isolation layer 128 and/or the second etch stop layer 126 is mitigated. Thus, delamination of the first magnetic layer 112 from adjacent layers may be mitigated and/or eliminated, thereby increasing a performance, endurance, and reliability of the inductor structure 109.

The height step h1 may, for example, be within a range of about 0 to 15 micrometers. In some embodiments, if the step height h1 is less than 0 micrometers, then the second magnetic layer 124 may be disposed within the trench 110t defined within the first dielectric layer 110. This may increase a structural integrity of the inductor structure 109, but may also increase complexity, costs, and time associated with fabrication of the IC 100. In further embodiments, if the step height h1 is less than 15 micrometers and greater than 0 micrometers, then a design and fabrication of the shape and size of the second magnetic layer 124 may be more easily achieved while preventing and/or mitigating delamination of the first magnetic layer 112. This may increase a structural integrity, a reliability, and an endurance of the inductor structure 109.

Figure 2:
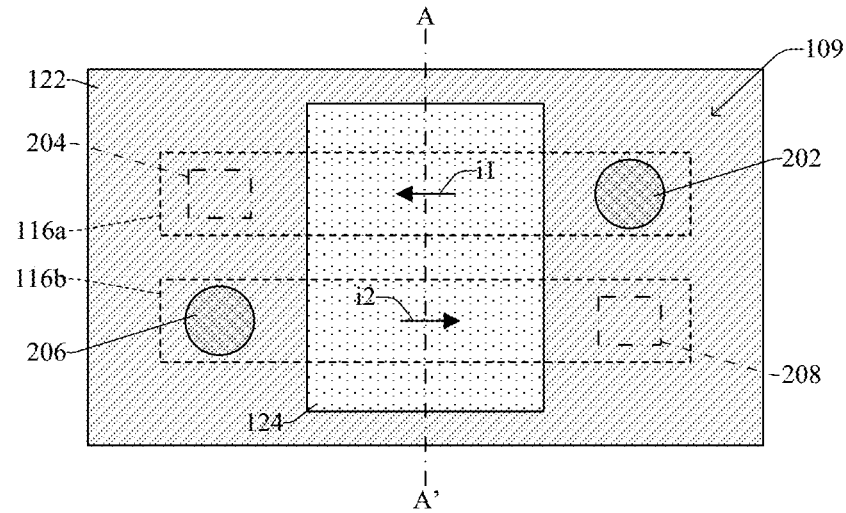
FIG. 2 illustrates a top view of some alternative embodiments of the IC of FIG. 1 according to the cut line A-A'.

FIG. 2 illustrates a top view 200 of some alternative embodiments of the IC 100 of FIG. 1 according to the cut line A-A'. Note, an example of 202 and 206 are shown in cross-section in FIG. 3, and are not illustrated in FIG. 1.

The second magnetic layer 124 extends continuously across a middle segment of the first and second conductive wires 116a-b. The first magnetic layer (112 of FIG. 1) directly underlies the second magnetic layer 124. The first conductive wire 116a extends from a first input/output (I/O) structure 202 of the inductor structure 109 to a second I/O structure 204. In some embodiments, the first conductive wire 116a extends continuously from the first I/O structure 202 to the second I/O structure 204 in a substantially straight line. In other embodiments, the first conductive wire 116a continuously extends from the first I/O structure 202 to the second I/O structure 204 in a helical pattern around the first magnetic layer 112. The second conductive wire 116b extends from a third I/O structure 206 of the inductor structure 109 to a fourth I/O structure 208. In some embodiments, the second conductive wire 116b extends continuously from the third I/O structure 206 to the fourth I/O structure 208 in a substantially straight line. In other embodiments, the second conductive wire 116b continuously extends from the third I/O structure 206 to the fourth I/O structure 208 in a helical pattern around the first magnetic layer 112.

During operation of the inductor structure 109, the first current i1 flows from the first I/O structure 202 to the second I/O structure 204 through the first conductive wire 116a, thereby inducing the first magnetic field (130 of FIG. 1) around the first conductive wire 116a. The second current i2 flows from the third I/O structure 206 to the fourth I/O structure 208 through the second conductive wire 116b, thereby inducing the second magnetic field (132 of FIG. 1) around the second conductive wire 116b. In some embodiments, as illustrated in FIG. 2, the first current i1 flows in a first direction and the second current i2 flows in a second direction opposite the first direction.

Figure 3:
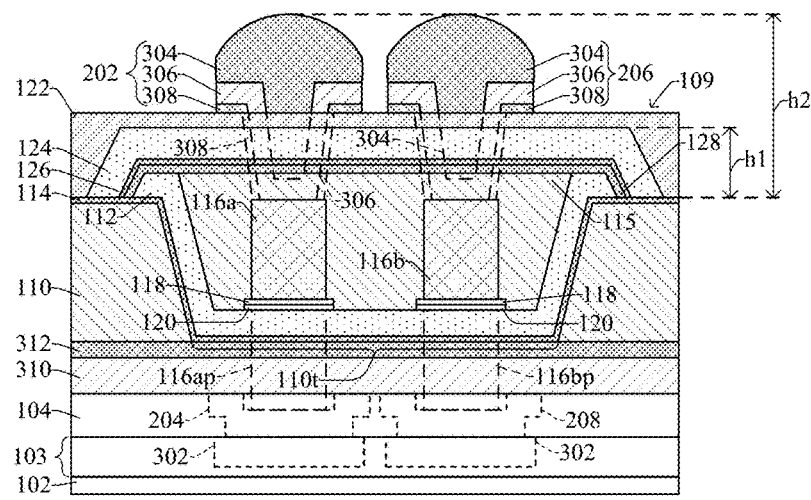
FIG. 3 illustrates a cross-sectional view of some embodiments of an IC including an inductor structure recessed into a first dielectric layer and input/output (I/O) structures electrically coupled to the inductor structure.

FIG. 3 illustrates a cross-sectional view of an IC 300 according to some alternative embodiments of the IC 100 of FIG. 1.

An interconnect buffer layer 310 overlies the passivation layer 104. In some embodiments, the interconnect buffer layer 310 may, for example, be or comprise a nitride, silicon nitride, an oxide (e.g., silicon dioxide), or the like and/or may have a thickness within a range of about 4.25 to 4.75 micrometers. An interconnect isolation layer 312 is disposed between the first etch stop layer 114 and the passivation layer 104. The interconnection isolation layer 312 may, for example, be or comprise silicon nitride, silicon carbide, or the like. The first I/O structure 202 overlies the first conductive wire 116a and directly contacts an upper surface of the first conductive wire 116a (as illustrated by the dashed lines in FIG. 3). The third I/O structure 206 overlies the second conductive wire 116b and directly contacts an upper surface of the second conductive wire 116b (as illustrated by the dashed lines in FIG. 3). As illustrated in the top view 200 of FIG. 2, the first and third I/O structures 202, 206 are each laterally offset from the second magnetic layer 124 by a non-zero distance. The first and third I/O structures 202, 206 each extend through the upper dielectric layer 122 to respectively contact the first and second conductive wires 116a-b.

In some embodiments, the first and third I/O structures 202, 206 each include a bond structure dielectric layer 308, an upper bond pad 306, and a solder bump 304. In some embodiments, the upper bond pad 306 may, for example, be or comprise copper, aluminum, gold, or the like. The solder bump 304 is configured to be bonded to and/or electrically coupled to a top conductive line and/or an external bond structure of an external IC. Thus, the first and third I/O structures 202, 206 are configured to electrically couple the first and second conductive wires 116a-b to an external IC.

The first conductive wire 116a includes a first conductive protrusion 116ap that extends below the first magnetic layer 112 to the second I/O structure 204. The second conductive wire 116b includes a second conductive protrusion 116bp that extends below the first magnetic layer 112 to the fourth I/O structure 208. The first and second conductive protrusions 116ap, 116bp are each laterally offset from the first magnetic layer 112 and continuously extend through the interconnect buffer layer 310, interconnect isolation layer 312, and the passivation layer 104. Thus, the first and second conductive wires 116a-b are electrically coupled to the second and fourth I/O structures 204, 208, respectively. The second and fourth I/O structures 204, 208 may each be configured as lower bond pad structures and may, for example, be or comprise aluminum, copper, aluminum copper, or the like. The second and fourth I/O structures 204, 208 each contact a conductive interconnect wire 302. The conductive interconnect wires 302 are a part of the interconnect structure 103 and are electrically coupled to semiconductor devices (e.g., transistors) disposed over and/or within the substrate 102. The first and second conductive protrusions 116ap, 116bp are segments of the first and second conductive wires 116a-b, respectively.

In some embodiments, the substantially flat upper surface of the second magnetic layer 124 is vertically offset from the top surface of the first etch stop layer 114 by the step height h1. An upper surface of the first and/or third I/O structures 202, 206 is vertically offset from the top surface of the first etch stop layer 114 by a height h2. The height h2 is greater than the step height h1. In some embodiments, the height h2 is at least two times greater than the step height h1. By virtue of the height h2 being greater than the step height h1, complications during a bonding process between the first and/or third I/O structures 202, 206 and other conductive structure (e.g., an upper conductive wire and/or an external bond structure). For example, in some embodiments, if the second magnetic layer 124 had a raised and/or semi-circle upper surface with an increased step height h1 (e.g., approximately equal to and/or greater than the height h2), then the shaped and/or size of the second magnetic layer 124 may adversely affect and/or prevent the bonding process. In such embodiments, the raised and/or semi-circle upper surface of the second magnetic layer 124 may cause delamination between the first and/or third I/O structures 202, 206 and the other conductive structure, thereby resulting in breakdown of the inductor structure 109. Therefore, by disposing the first magnetic layer 112 and/or the first and second conductive wires 116a-b in the trench 110t of the first dielectric layer 110, a performance, structural integrity, and reliability of the inductor structure 109 may be increased. In addition, this decreases design and fabrication complexity of the inductor structure 109.

Figure 4:
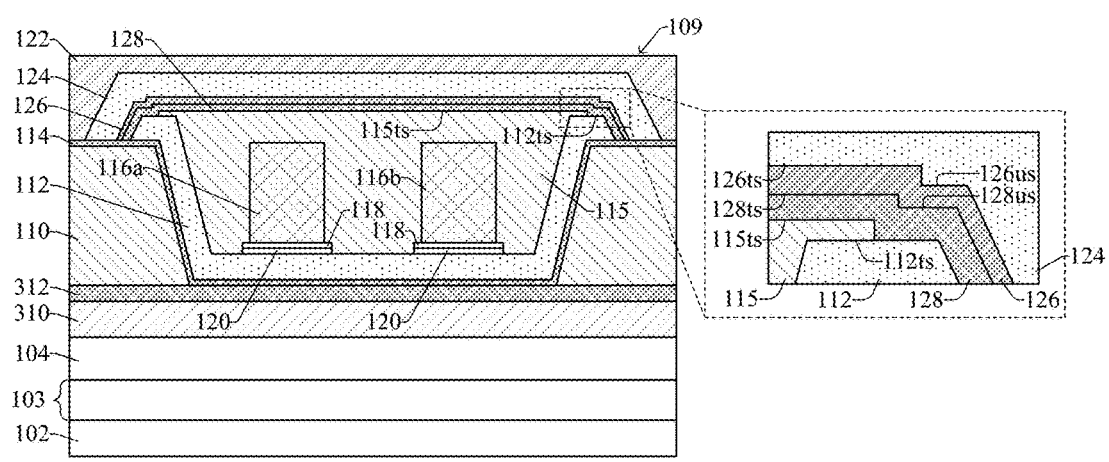
FIG. 4 illustrates a cross-sectional view of an IC according to some alternative embodiments of the IC of FIG. 1.

FIG. 4 illustrates a cross-sectional view of an IC 400 according to some alternative embodiments of the IC 100 of FIG. 1.

The second dielectric layer 115 has a substantially flat top surface 115ts that is disposed vertically above a top surface 112ts of the first magnetic layer 112. The second isolation layer 128 has a top surface 128ts that is disposed vertically above an upper surface 128us of the second isolation layer 128. The second etch stop layer 126 has a top surface 126ts that is vertically above an upper surface 126us of the second etch stop layer 126.

Figure 5:
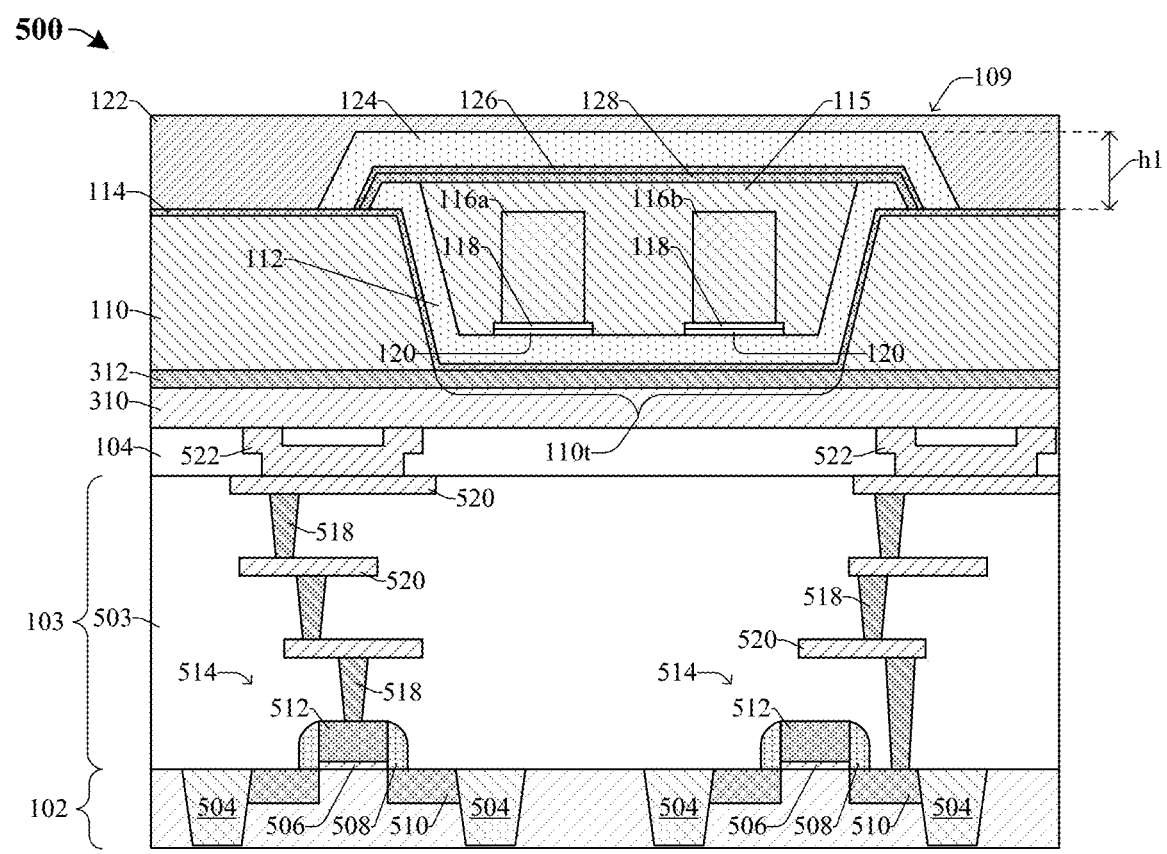
FIG. 5 illustrates a cross-sectional view of an IC including an inductor structure recessed into a first dielectric layer and overlying an interconnect structure.

FIG. 5 illustrates a cross-sectional view of some embodiments of an IC 500 that includes an embodiment of the inductor structure 109 of FIG. 1.

The IC 500 includes the interconnect structure 103 overlying the substrate 102. The substrate 102 may, for example, be or comprise a bulk substrate (e.g., a bulk silicon substrate) or a silicon-on-insulator (SOI) substrate. A plurality of transistors 514 are disposed within and/or over the substrate 102. The transistors 514 may, for example, be metal-oxide-semiconductor field-effect transistors (MOSETs). The transistors 514 each include source/drain regions 510 disposed in the substrate 102 and laterally spaced apart from one another. A gate dielectric layer 506 overlies the substrate 102 between the source/drain regions 510, and a gate electrode 512 overlies the gate dielectric layer 506. In some embodiments, the gate electrode 512 may, for example, be or comprise polysilicon, or another suitable conductive material. The substrate 102 comprises a first doping type (e.g., p-type) and the source/drain regions 510 comprise a second doping type (e.g., n-type) opposite the first doping type. Further, a sidewall spacer structure 508 is disposed along sidewalls of the gate dielectric layer 506 and the gate electrode 512. The transistors 514 are disposed between an isolation structure 504 that extends from an upper surface of the substrate 102 to a point below the upper surface of the substrate 102. In some embodiments, the isolation structure 504 is configured as a shallow trench isolation (STI) structure and comprises one or more dielectric materials (e.g., silicon dioxide).

The interconnect structure 103 includes an interconnect dielectric structure 503, interconnect vias 518, and interconnect wires 520. The interconnect vias 518 and the interconnect wires 520 are alternatingly stacked within the interconnect dielectric structure 503. In some embodiments, the interconnect dielectric structure 503 comprises one or more inter-level dielectric (ILD) layers. The one or more ILD layers may, for example, be or comprise an oxide (e.g., silicon dioxide), a low-k dielectric material, a combination of the foregoing, or the like. The interconnect vias and/or wires 518, 520 may, for example, each be or comprise copper, aluminum, tungsten, a combination of the foregoing, or some other suitable conductive material.

The passivation layer 104 overlies the interconnect structure 103. The passivation layer 104 may, for example, be or comprise silicon dioxide, silicon nitride, polyimide compounds, or other suitable materials. In some embodiments, a plurality of bond pad structures 522 are disposed within the passivation layer 104. Each bond pad structure 522 may overlie an underlying interconnect wire 520. Thus, the bond pad structures 522 are electrically coupled to the transistors 514 by way of the interconnect structure 103. In some embodiments, the bond pad structures 522 may, for example, each be or comprise aluminum, copper, aluminum copper, or the like.

A first dielectric layer 110 is disposed over the passivation layer 104. At least a portion of the inductor structure 109 is disposed within a trench 110t defined by the first dielectric layer 110. This, in part, increases a structural integrity of the inductor structure 109 and mitigates and/or eliminates a complexity of fabrication of the inductor structure 109.

FIGS. 6-15 illustrate cross-sectional views 600-1500 of some embodiments of a first method of forming an inductor structure recessed into a first dielectric layer according to the present disclosure. Although the cross-sectional views 600-1500 shown in FIGS. 6-15 are described with reference to a method, it will be appreciated that the structures shown in FIGS. 6-15 are not limited to the method but rather may stand alone separate of the method. Furthermore, although FIGS. 6-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6:
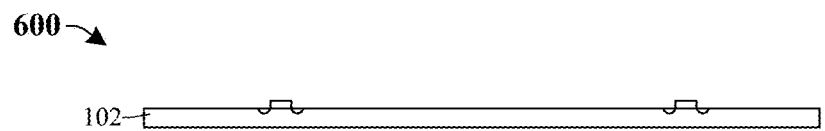
FIGS. 6-15 illustrate cross-sectional views of some embodiments of a first method of forming an inductor structure recessed into a first dielectric layer.

As illustrated by the cross-sectional view 600 of FIG. 6, a substrate 102 is provided. In some embodiments, the substrate 102 may comprise any type of semiconductor body (e.g., monocrystalline silicon, silicon germanium (SiGe), silicon-on-insulator (SOI), etc.). In some embodiments, semiconductor devices are formed within/over the substrate 102. For example, the semiconductor device may be a transistor including a gate stack (e.g., a metal gate disposed over a high-k dielectric) disposed over the semiconductor substrate 102 and between a source and drain, while the source and drain are disposed within the semiconductor substrate 102.

In some embodiments, a process for forming the semiconductor devices includes forming a patterned photoresist layer (not shown) on the semiconductor substrate 102. The patterned photoresist layer may, for example, be formed by a spin-on process. The patterned photoresist layer may, for example, be patterned with a layout having a plurality of sources/drains and may, for example, be patterned using photolithography. In some embodiments, the process for forming the source/drain of the semiconductor devices comprises performing ion implantation with the patterned photoresist in place, and subsequently stripping the patterned photoresist. Further, in some embodiments, the gate may be, for example, formed by chemical vapor deposition (CVD), physical vapor deposition (PVD), sputtering, or some other deposition or growth process with the patterned photoresist (not shown) in place, and subsequently stripping the patterned photoresist.

Figure 7:
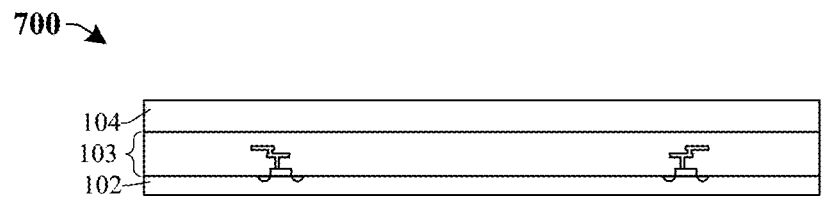

As illustrated by the cross-sectional view 700 of FIG. 7, an interconnect structure 103 is formed over and in direct contact with the semiconductor substrate 102. The interconnect structure 103 includes a plurality of conductive features, such as metal interconnect wires, and/or vias interconnecting semiconductor devices. In some embodiments, the plurality of conductive features are formed in a plurality of metal layers formed over one another. In some embodiments, the conductive features may be formed by a combination of photolithography and applicable deposition or growth processes, such as electrochemical plating, electroless plating, chemical or physical vapor deposition, sputtering, or some other deposition or growth process. The process may, for example, be part of a single damascene like process or a dual damascene like process. In some embodiments, a chemical mechanical polishing (CMP) process may be performed after forming each metal layer to form substantially flat upper surfaces.

Also illustrated in FIG. 7, after forming the interconnect structure 103, a passivation layer 104 is formed over the interconnect structure 103. The passivation layer 104 may comprise a dielectric material, such as silicon dioxide (SiO2), silicon nitride (Si3N4), polyimide compounds, or other suitable materials. The passivation layer 104 may, for example, be formed by a deposition or growth process, such as CVD, PVD, or some other deposition or growth process.

Figure 8:
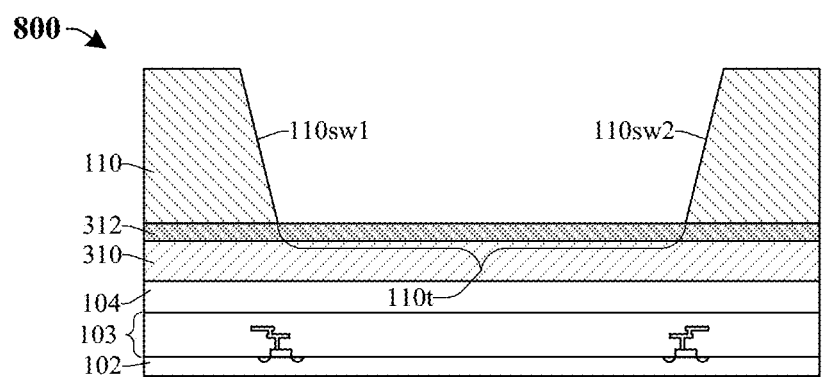

As shown in cross-sectional view 800 of FIG. 8, an interconnect buffer layer 310 is formed over an upper surface of the passivation layer 104. In some embodiments, the interconnect buffer layer 310 may, for example, be or comprise a nitride, silicon nitride, or the like. An interconnect isolation layer 312 is formed over the interconnect buffer layer 310. In some embodiments, the interconnect isolation layer 312 may, for example, be or comprise silicon nitride, silicon carbide, or the like. A first dielectric layer 110 is formed over the interconnect isolation layer 312. The first dielectric layer 110 may, for example, be a polyimide compound, a polybenzoxazole compound, or any other suitable dielectric material and/or may be formed to a thickness within a range of about 16 to 20 micrometers. Subsequently, a patterning process is performed, thereby forming opposing sidewalls 110sw1, 110sw2 in the first dielectric layer 110 that define a trench 110t in the first dielectric layer 110. In some embodiments, a process for patterning the first dielectric layer 110 include: forming a masking layer (not shown) over the first dielectric layer 110; exposing unmasked regions of the first dielectric layer 110 to one or more etchants, thereby defining the trench 110t; and performing a removal process to remove the masking layer. Subsequently, in some embodiments, a curing process may be performed on the first dielectric layer 110 to harden and/or toughen the first dielectric layer 110. In some embodiments, the curing process may, for example, be or comprise a pressure curing process, a thermal curing process, or any other suitable curing process(es). In some embodiments, the interconnect buffer layer 310, the interconnect isolation layer 312, and/or the first dielectric layer 110 may be deposited and/or grown by CVD, PVD, atomic layer deposition (ALD), or another suitable deposition process.

Figure 9:
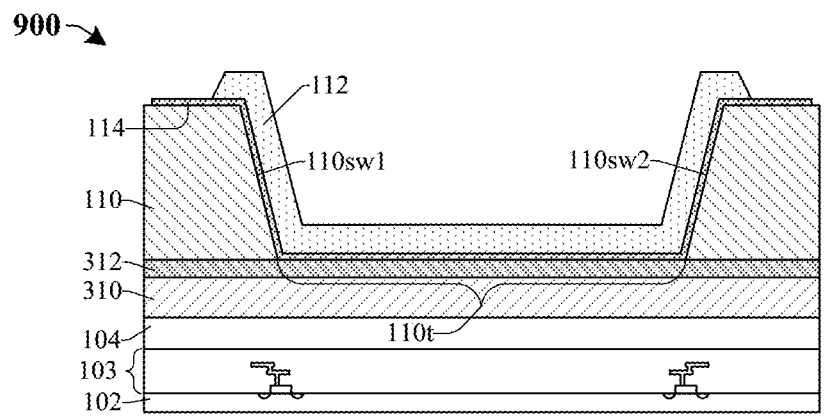

As shown in cross-sectional view 900 of FIG. 9, a first etch stop layer 114 is formed over the first dielectric layer 110 and the interconnect isolation layer 312. In some embodiments, the first etch stop layer 114 may, for example, be or comprise a metal oxide, such as tantalum oxide, titanium oxide, another suitable etch stop material, or the like. In some embodiments, a method for forming the first etch stop layer 114 may include: forming a metal material (e.g., tantalum) over the first dielectric layer 110; and subsequently performing a thermal annealing process (e.g., with water (H2O)) to convert the metal material to a metal oxide. The first etch stop layer 114 may continuously line the trench 110t and/or may directly contact the opposing sidewalls 110sw1, 110sw2. A first magnetic layer 112 is formed over the first etch stop layer 112. The first magnetic layer 112 may, for example, be or comprise Cobalt Zirconium Tantalum (CZT), an iron-nickel (NiFe) compound, or other suitable magnetic materials and/or may have a thickness within a range of 3 to 10 micrometers. Subsequently, an etch process is performed on the first magnetic layer 112. In some embodiments, the etch process includes: forming a masking layer (not shown) over the first magnetic layer 112; performing a wet etch process on unmasked regions of the first magnetic layer 112; and performing a removal process to remove the masking layer.

After performing an etch process on the first magnetic layer 112, the first etch stop layer 114 may be patterned. In some embodiments, patterning the first etch stop layer 114 may include: forming a masking layer (not shown) over the first etch stop layer 114; performing a dry etch process on unmasked regions of the first etch stop layer 114; and performing a removal process to remove the masking layer. In some embodiments, a process for forming the first magnetic layer 112 comprises depositing the first magnetic layer 112 by, for example, CVD, PVD, sputtering, or some other deposition or growth process. In further embodiments, the first etch stop layer 114 may be deposited and/or grown, for example, by CVD, PVD, ALD, or another suitable deposition process.

In some embodiments, by forming at least a portion of the first magnetic layer 112 in the trench 110t, delamination of the first magnetic layer 112 from the first etch stop layer 114, the first dielectric layer 110, and/or another layer may be mitigated and/or eliminated. This may increase a structural integrity of the first magnetic layer 112 and any other layer/structure formed over the first magnetic layer 112. Further, the foregoing fabrication method may reduce a complexity and/or design of forming the first magnetic layer 112.

Figure 10:
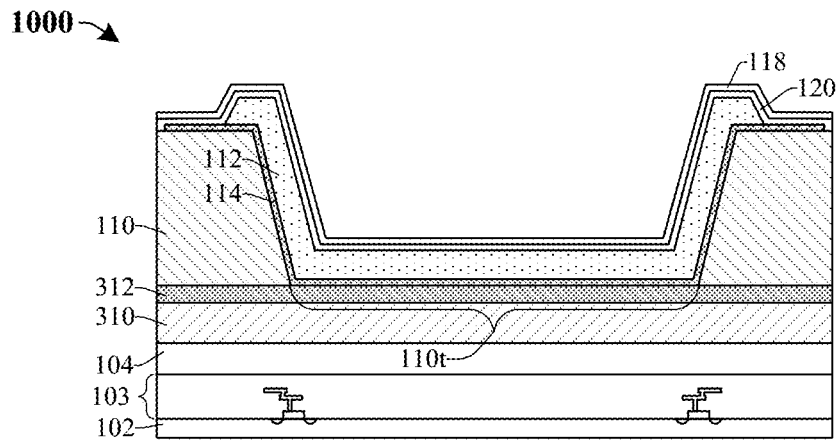

As shown in cross-sectional view 1000 of FIG. 10, a first isolation layer 120 is formed over the first magnetic layer 112. The first isolation layer 120 may, for example, be or comprise a dielectric material, such as silicon dioxide, silicon nitride, a low-k dielectric, or some other suitable dielectric material. The first isolation layer 120 may, for example, be deposited or grown by CVD, PVD, ALD, or some other deposition or growth process. In some embodiments, the first isolation layer 120 conformally lines a surface of the first magnetic layer 112 and is disposed within the trench 110t.

Also shown in FIG. 10, a barrier seed layer 118 is formed over the first isolation layer 120. The barrier seed layer 118 may, for example, be or comprise copper, aluminum, aluminum, gold, silver, alloy(s) of the foregoing, or other suitable materials. The barrier seed layer 118 may, for example, be deposited or grown by CVD, PVD, sputtering, electrochemical plating, electroless plating, or some other deposition or growth process. In some embodiments, the barrier seed layer 118 conformally lines a surface of the first isolation layer 120 and is disposed within the trench 110t.

Figure 11:
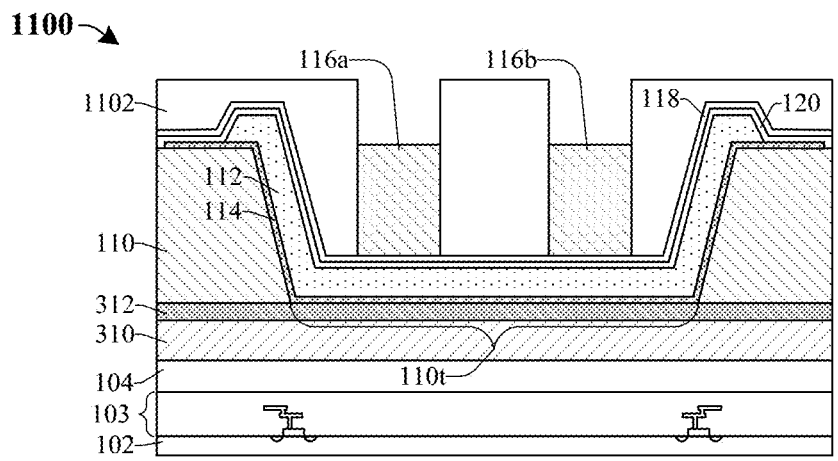

As shown in cross-sectional view 1100 of FIG. 11, a first conductive wire 116a and a second conductive wire 116b are formed over and in direct contact with the barrier seed layer 118. In some embodiments, the first and second conductive wires 116a-b are formed with a patterned photoresist layer 1102 in place. The patterned photoresist layer 1102 is formed over the barrier seed layer 118 by, for example, a spin-on process in combination with a subsequent photolithograph process to define openings in the patterned photoresist layer 1102. The first and second conductive wires 116a-b may, for example, each be or comprise copper, aluminum, gold, silver, aluminum copper, alloy(s) of the foregoing, or any other suitable conductive material. The first and second conductive wires 116a-b may, for example, be deposited or grown by CVD, PVD, sputtering, electrochemical plating (ECP), electroless plating, or some other deposition or growth process. In further embodiments, the first and second conductive wires 116a-b may each be deposited or grown in the openings of the patterned photoresist layer 1102 by ECP, wherein the barrier seed layer 118 acts as a seed layer in which the first and second conductive wires 116a-b may be grown from.

Figure 12:
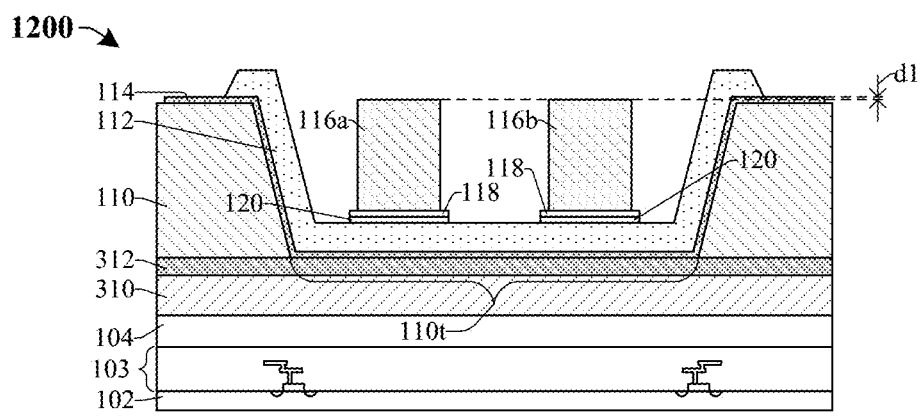

As shown in cross-sectional view 1200 of FIG. 12, the patterned photoresist layer (1102 of FIG. 11) is stripped from the barrier seed layer 118 by, for example, a wet etch or a dry etch process. In some embodiments, the stripping of the patterned photoresist layer (1102 of FIG. 11) also removes at least a portion of the barrier seed layer 118 and/or the first isolation layer 120 that is not covered by the first and/or second conductive wires 116a-b. In other embodiments, a subsequent etching and photolithography process is performed to remove portions of the barrier seed layer 118 and the first isolation layer 120 that are laterally offset from the first and/or second conductive wires 116a-b. In some embodiments, after the aforementioned processing steps, a top surface of the first and second conductive wires 116a-b is vertically offset from a top surface of the first etch stop layer 114 by a distance d1. In some embodiments, the distance d1 is non-zero. In further embodiments, the top surface of the first and second conductive wires 116a-b is below the top surface of the first etch stop layer 114. In further embodiments, the top surface of the first and second conductive wires 116a-b is below a top surface of the first dielectric layer 110.

Figure 13:
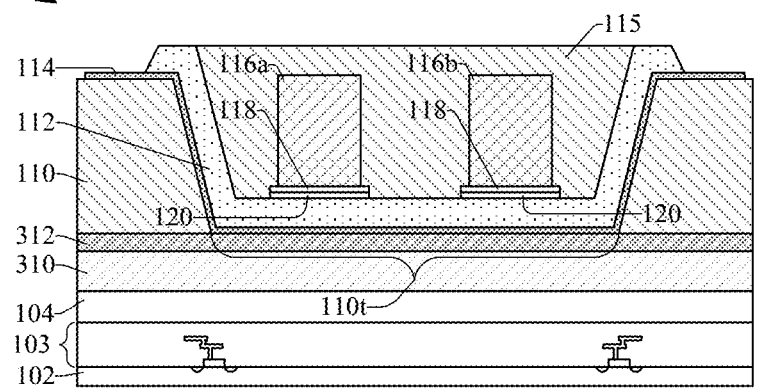

As shown in cross-sectional view 1300 of FIG. 13, a second dielectric layer 115 is formed over the first and second conductive wires 116a-b and the first magnetic layer 112. The second dielectric layer 115 conformally surrounds the first and second conductive wires 116a-b and fills a remaining portion of the trench 110t. In some embodiments, the second dielectric layer 115 is configured to electrically isolate the first and second conductive wires 116a-b from one another. The second dielectric layer 115 may, for example, be a polyimide compound, a polybenzoxazole compound, or any other suitable dielectric material. Subsequently, a patterning process is performed on the second dielectric layer 115. In some embodiments, a process for patterning the second dielectric layer 115 includes: forming a masking layer (not shown) over the second dielectric layer 115; exposing unmasked regions of the second dielectric layer 115 to one or more etchants; and performing a removal process to remove the masking layer. Subsequently, in some embodiments, a curing process may be performed on the second dielectric layer 115 to harden and/or toughen the second dielectric layer 115. In some embodiments, the curing process may, for example, be or comprise a pressure curing process, a thermal curing process, or any other suitable curing process(es). In some embodiments, the second dielectric layer 115 may be deposited and/or grown by CVD, PVD, ALD, or another suitable deposition process. In some embodiments, the second dielectric layer 115 may have a substantially flat upper surface that may be level with an upper surface of the first magnetic layer 112. In some embodiments, the substantially flat upper surface of the second dielectric layer 115 may be formed by the patterning process (e.g., an etch process) and/or by a planarization process (e.g., a CMP process).

In some embodiments, by forming the second dielectric layer 115 within the trench 110t and along inner sidewalls and an upper surface of the first magnetic layer 112, a shape and/or thickness of the second dielectric layer 115 may be more easily controlled. This, in part, may decreases time and costs associated with forming an inductor structure (109 of FIG. 15) and/or may increase a structural integrity of the first and second conductive wires 116a-b.

Figure 14:
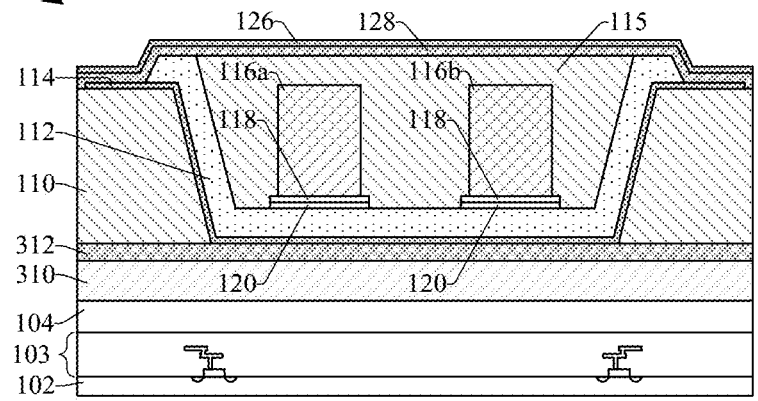

As shown in cross-sectional view 1400 of FIG. 14, a second isolation layer 128 is formed over the second dielectric layer 115 and the first magnetic layer 112. The second isolation layer 128 may, for example, be or comprise a nitride, silicon nitride, or another suitable dielectric material. A second etch stop layer 126 is formed over the second isolation layer 128. In some embodiments, the second etch stop layer 126 may, for example, be or comprise a metal oxide, such as tantalum oxide, titanium oxide, another suitable etch stop material, or the like. In some embodiments, a method for forming the second etch stop layer 126 may include: forming a metal material (e.g., tantalum) over the second isolation layer 128; and subsequently performing a thermal annealing process (e.g., with water (H2O)) to convert the metal material to a metal oxide. In some embodiments, the second isolation layer 128 and/or the second etch stop layer 126 may, for example, be deposited or grown by CVD, PVD, ALD, or some other suitable deposition or growth process. In some embodiments, a subsequent etching process (e.g., a wet etch and/or a dry etch process) (not shown) may be performed on the second isolation layer 128 and/or the second etch stop layer 126, wherein a portion of the aforementioned layers in regions laterally offset from the first magnetic layer 112 may be removed.

Figure 15:
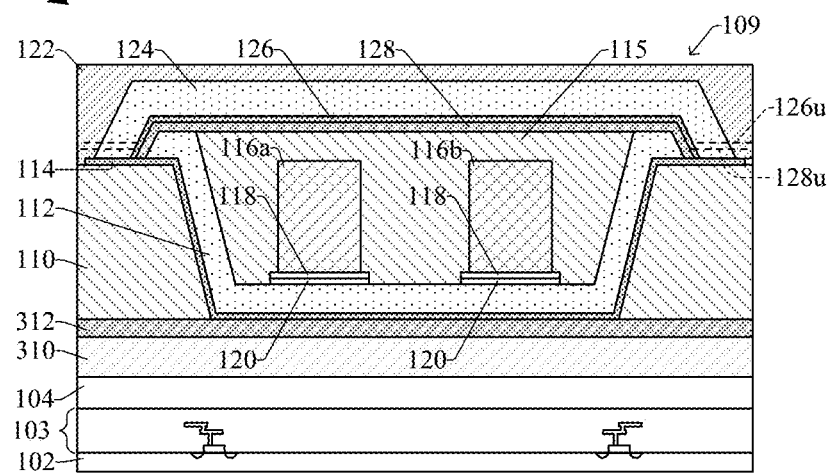

As shown in cross-sectional view 1500 of FIG. 15, a second magnetic layer 124 is formed over the first and second etch stop layers 126, 114, thereby forming an inductor 109. The second magnetic layer 124 may, for example, be or comprise Cobalt Zirconium Tantalum (CZT), an iron-nickel (NiFe) compound, or other suitable magnetic materials and/or may have a thickness within a range of 3 to 10 micrometers. Subsequently, an etch process is performed on the second magnetic layer 124. In some embodiments, the etch process includes: forming a masking layer (not shown) over the second magnetic layer 124; performing a wet etch process on unmasked regions of the second magnetic layer 124; and performing a removal process to remove the masking layer. An upper dielectric layer 122 is formed over the second magnetic layer 124. The upper dielectric layer 122 may, for example, be or comprise an oxide (e.g., silicon dioxide), a low-k dielectric material, another suitable dielectric material, or the like.

In some embodiments, the second isolation layer 128 and/or the second etch stop layer 126 are not etched and/or patterned (e.g., with reference to FIG. 14) until after the second magnetic layer 124 is formed. In such embodiments, a bottom surface of the second magnetic layer 124 extends along an upper surface 126u of the second etch stop layer 126 (not shown) or along an upper surface 128u of the second isolation layer 128 (not shown). In such embodiments, after forming the second magnetic layer 124, a wet etch process may be performed on the second isolation layer 128 and/or the second etch stop layer 126 to remove portions of the aforementioned layers in regions laterally offset from the second magnetic layer 124.

Figure 16:
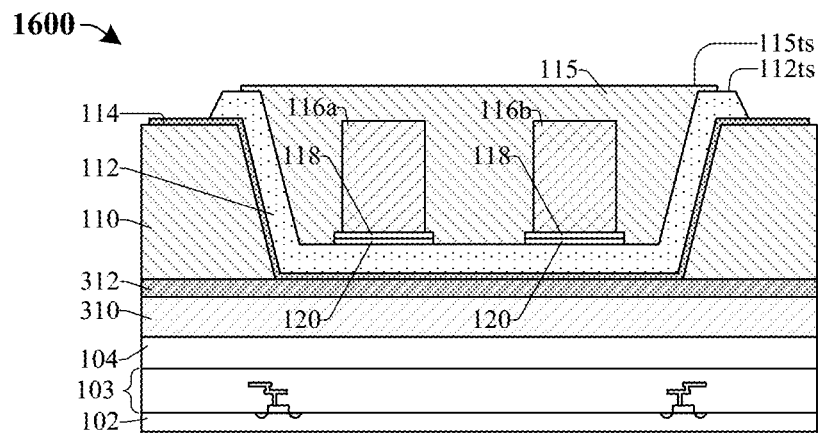
FIGS. 16-18 illustrate cross-sectional views of some embodiments of a second method of forming an inductor structure recessed into a first dielectric layer.
Figure 17:
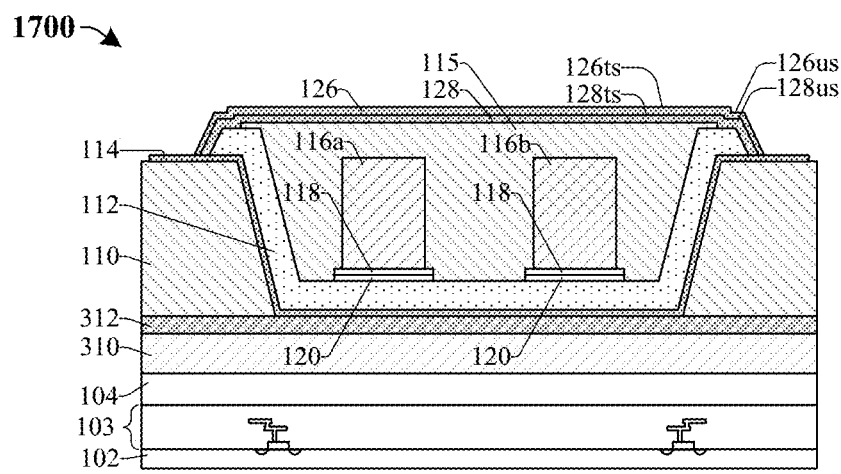
Figure 18:
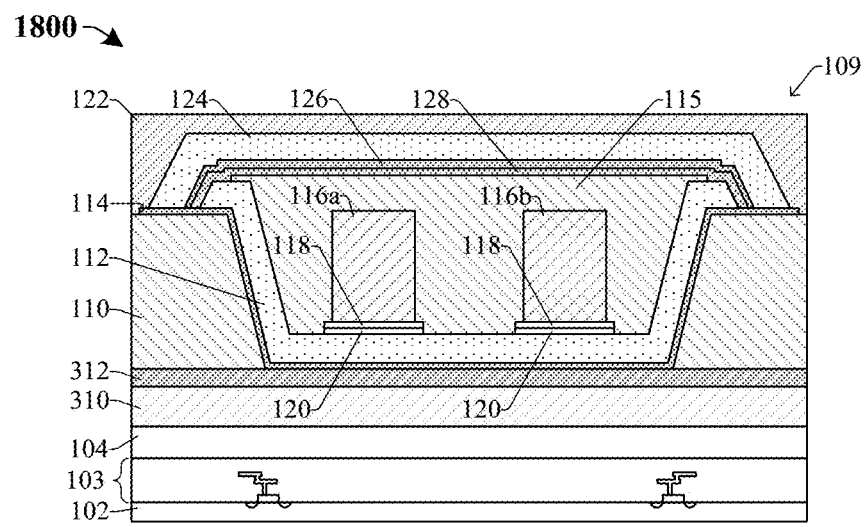

FIGS. 16-18 illustrate cross-sectional views 1600-1800 of some embodiments of a second method of forming an inductor structure recessed into a first dielectric layer according to the present disclosure. Although the cross-sectional views 1600-1800 shown in FIGS. 16-18 are described with reference to a method, it will be appreciated that the structures shown in FIGS. 16-18 are not limited to the method but rather may stand alone separate of the method. Furthermore, although FIGS. 16-18 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

As shown in cross-sectional view 1600 of FIG. 16, a second dielectric layer 115 is formed over the first and second conductive wires 116a-b and the first magnetic layer 112. In some embodiments, the structure of FIG. 16 is formed as illustrated and/or described in FIGS. 6-12. The second dielectric layer 115 conformally surrounds the first and second conductive wires 116a-b and fills a remaining portion of the trench 110t. In some embodiments, the second dielectric layer 115 is configured to electrically isolate the first and second conductive wires 116a-b from one another. The second dielectric layer 115 may, for example, be a polyimide compound, a polybenzoxazole compound, silicon nitride, tantalum oxide, or any other suitable dielectric material. Subsequently, a patterning process is performed on the second dielectric layer 115. In some embodiments, a process for patterning the second dielectric layer 115 includes: forming a masking layer (not shown) over the second dielectric layer 115; exposing unmasked regions of the second dielectric layer 115 to one or more etchants; and performing a removal process to remove the masking layer. Subsequently, in some embodiments, a curing process may be performed on the second dielectric layer 115 to harden and/or toughen the second dielectric layer 115. In some embodiments, the curing process may, for example, be or comprise a pressure curing process, a thermal curing process, or any other suitable curing process(es). In some embodiments, the second dielectric layer 115 may be deposited and/or grown by CVD, PVD, ALD, or another suitable deposition process. In some embodiments, the second dielectric layer 115 may have a substantially flat top surface 115ts that is vertically above a top surface 112ts of the first magnetic layer 112. In such embodiments, the substantially flat top surface 115ts of the second dielectric layer 115 may be achieved by the patterning process or by performing a planarization process (e.g., a CMP) on the second dielectric layer 115.

As shown in cross-sectional view 1700 of FIG. 17, a second isolation layer 128 is formed over the second dielectric layer 115 and the first magnetic layer 112. The second isolation layer 128 may, for example, be or comprise a nitride, silicon nitride, or another suitable dielectric material. The second isolation layer 128 may, for example, have a top surface 128ts that is vertically above an upper surface 128us of the second isolation layer 128. A second etch stop layer 126 is formed over the second isolation layer 128. In some embodiments, the second etch stop layer 126 may, for example, be or comprise a metal oxide, such as tantalum oxide, titanium oxide, another suitable etch stop material, or the like. In some embodiments, a method for forming the second etch stop layer 126 may include: forming a metal material (e.g., tantalum) over the second isolation layer 128; and subsequently performing a thermal annealing process (e.g., with water (H2O)) to convert the metal material to a metal oxide. Further, the second etch stop layer 126 has a top surface 126ts that is vertically above an upper surface 126us of the second etch stop layer 126. In some embodiments, the second isolation layer 128 and/or the second etch stop layer 126 may, for example, be deposited or grown by CVD, PVD, ALD, or some other suitable deposition or growth process.

In some embodiments, a subsequent etching process (e.g., a wet etch and/or a dry etch process) (not shown) may be performed on the second isolation layer 128 and/or the second etch stop layer 126, wherein a portion of the aforementioned layers in regions laterally offset from the first magnetic layer 112 may be removed.

As shown in cross-sectional view 1800 of FIG. 18, a second magnetic layer 124 is formed over the first and second etch stop layers 126, 114, thereby forming an inductor 109. The second magnetic layer 124 may, for example, be or comprise Cobalt Zirconium Tantalum (CZT), an iron-nickel (NiFe) compound, or other suitable magnetic materials and/or may have a thickness within a range of 3 to 10 micrometers. Subsequently, an etch process is performed on the second magnetic layer 124. In some embodiments, the etch process includes: forming a masking layer (not shown) over the second magnetic layer 124; performing a wet etch process on unmasked regions of the second magnetic layer 124; and performing a removal process to remove the masking layer. Further, the second isolation layer 128 and/or the second etch stop layer 126 may be etched after forming the second magnetic layer 124 as illustrated and/or described in FIG. 15. An upper dielectric layer 122 is formed over the second magnetic layer 124. The upper dielectric layer 122 may, for example, be or comprise an oxide (e.g., silicon dioxide), a low-k dielectric material, another suitable dielectric material, or the like.

Figure 19:
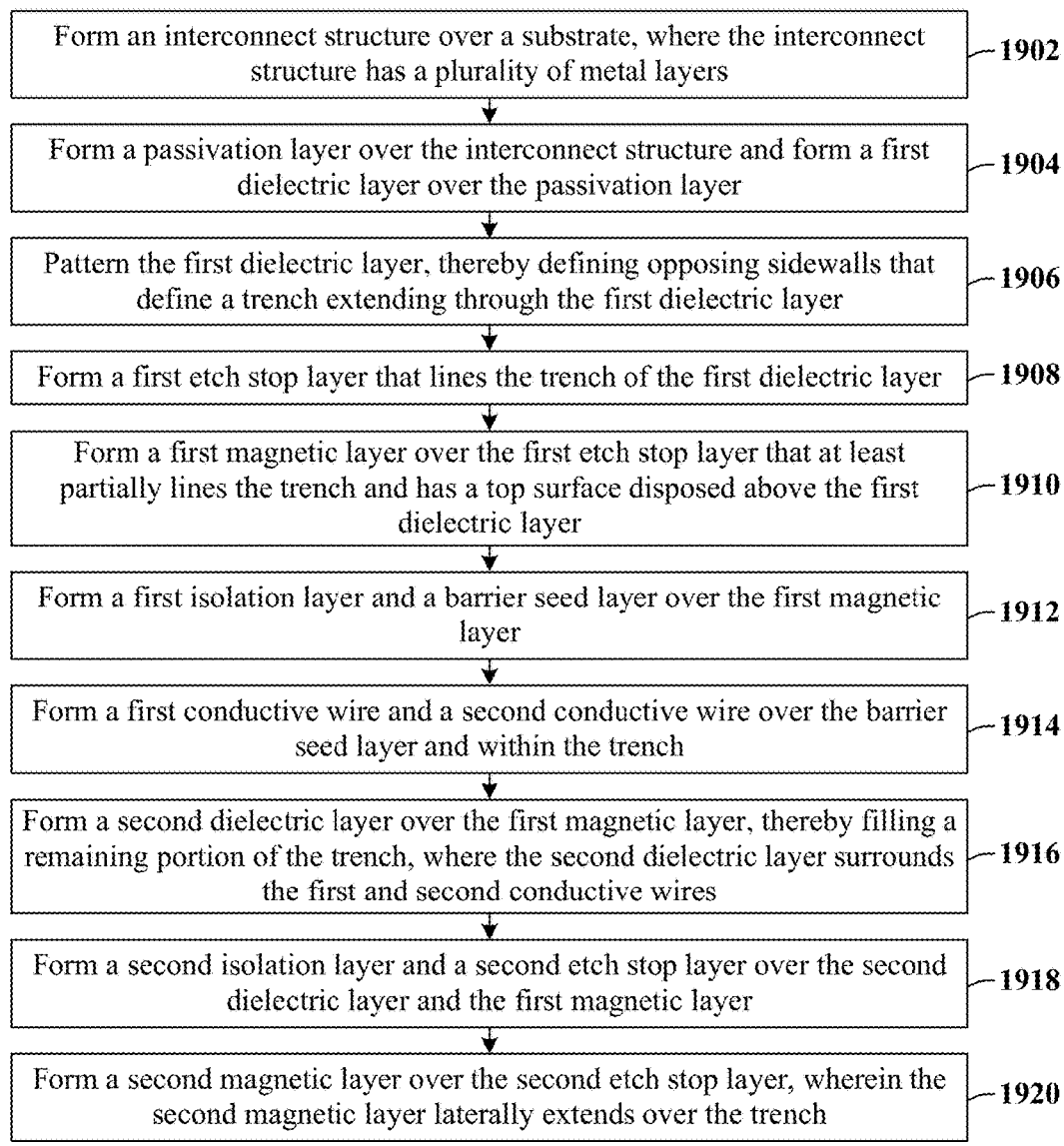
FIG. 19 illustrates a methodology in flowchart format that illustrates some embodiments of a method of forming an inductor structure recessed into a first dielectric layer.

FIG. 19 illustrates a method 1900 of forming an inductor structure recessed into a first dielectric layer according to the present disclosure. Although the method 1900 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1902, an interconnect structure is formed over a substrate. The interconnect structure has a plurality of metal layers. FIG. 7 illustrates a cross-sectional view 700 corresponding to some embodiments of act 1902.

At act 1904, a passivation layer is formed over the interconnect structure. A first dielectric layer is formed over the passivation layer. FIG. 8 illustrates a cross-sectional view 800 corresponding to some embodiments of act 1904.

At act 1906, the first dielectric layer is patterned, thereby defining opposing sidewalls that define a trench extending through the first dielectric layer. FIG. 8 illustrates a cross-sectional view 800 corresponding to some embodiments of act 1906.

At act 1908, a first etch stop layer is formed over the first dielectric layer and lines the trench of the first dielectric layer. FIG. 9 illustrates a cross-sectional view 900 corresponding to some embodiments of act 1908.

At act 1910, a first magnetic layer is formed over the first etch stop layer that at least partially lines the trench and has a stop surface disposed above the first dielectric layer. FIG. 9 illustrates a cross-sectional view 900 corresponding to some embodiments of act 1910.

At act 1912, a first isolation layer and a barrier seed layer are formed over the first magnetic layer. FIG. 10 illustrates a cross-sectional view 1000 corresponding to some embodiments of act 1912.

At act 1914, a first conductive wire and a second conductive wire are formed over the barrier seed layer and within the trench. FIGS. 11-12 illustrate cross-sectional views 1100-1200 corresponding to some embodiments of act 1914.

At act 1916, a second dielectric layer is formed over the first magnetic layer, thereby filling a remaining portion of the trench. The second dielectric layer surrounds the first and second conductive wires. FIGS. 13 and 16 illustrate cross-sectional views 1300 and 1600 corresponding to some embodiments of act 1916.

At act 1918, for a second isolation layer and a second etch stop layer over the second dielectric layer and the first magnetic layer. FIGS. 14 and 17 illustrate cross-sectional views 1400 and 1700 corresponding to some embodiments of act 1918.

At act 1920, a second magnetic layer is formed over the second etch stop layer. The second magnetic layer laterally extends over the trench. FIGS. 15 and 18 illustrate cross-sectional views 1500 and 1800 corresponding to some embodiments of act 1920.

Accordingly, in some embodiments, the present disclosure relates to an inductor structure including magnetic layers surrounding a first and second conductive wire, where the first and second conductive wires are disposed within a trench defined by a dielectric layer.

In some embodiments, the present application provides an integrated circuit (IC) including a substrate; an interconnect structure having a plurality of metal layers disposed over the substrate; a first dielectric layer disposed over an uppermost surface of the interconnect structure, wherein the first dielectric layer has opposing sidewalls defining a trench; a first magnetic layer disposed within the trench and conformally extending along the opposing sidewalls; conductive wires disposed within the trench and overlying the first magnetic layer; and a second magnetic layer overlying the first magnetic layer and the conductive wires, wherein the second magnetic layer laterally extends from over a first sidewall of the opposing sidewalls to a second sidewall of the opposing sidewalls.

In some embodiments, the present application provides an integrated circuit (IC) including a substrate; an interconnect structure having a plurality of metal layers overlying the substrate; a passivation layer overlying the interconnect structure; a first dielectric layer having slanted opposing sidewalls that define a trench overlying the passivation layer; a first etch stop layer extending along a top surface of the first dielectric layer and the slanted opposing sidewalls; a first magnetic layer overlying the first etch stop layer and disposed within the trench; a first conductive wire and a second conductive wire disposed within the trench and overlying the first magnetic layer, wherein the first and second conductive wires extend in parallel with one another along a first direction parallel to an upper surface of the substrate; a second dielectric layer filling the trench and enclosing the first and second conductive wires; and a second magnetic layer disposed over the first magnetic layer and the second dielectric layer, wherein the first and second magnetic layers wrap around the first and second conductive wires and laterally extend along a middle segment of the first and second conductive wires in the first direction.

In some embodiments, the present application provides a method for forming an integrated circuit (IC), the method includes forming an interconnect structure having a plurality of metal layers over a substrate; forming a passivation layer over an uppermost surface of the interconnect structure; forming a first dielectric layer over the passivation layer, wherein the first dielectric layer has sidewalls defining a trench; forming a first magnetic layer over the passivation layer, wherein the first magnetic layer lines the trench and extends over a top surface of the first dielectric layer; forming conductive wires spaced apart from one another over the first magnetic layer; forming a second dielectric layer over the conductive wires, wherein the second dielectric layer at least partially fills the trench; and forming a second magnetic layer over the second dielectric layer and the first magnetic layer, wherein the second magnetic layer has a substantially flat upper surface that continuously extends between the sidewalls of the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a substrate;
   an interconnect structure having a plurality of metal layers disposed over the substrate;
   a first dielectric layer disposed over an uppermost surface of the interconnect structure, wherein the first dielectric layer has opposing sidewalls defining a trench;
   a first magnetic layer disposed within the trench and conformally extending along the opposing sidewalls;
   conductive wires disposed within the trench and overlying the first magnetic layer, wherein a top surface of the conductive wires is vertically below a top surface of the first magnetic layer; and
   a second magnetic layer overlying the first magnetic layer and the conductive wires, wherein the second magnetic layer laterally extends from over a first sidewall of the opposing sidewalls to a second sidewall of the opposing sidewalls.

2. The IC of claim 1, wherein an upper surface of the second magnetic layer is substantially flat, and wherein the upper surface of the second magnetic layer continuously extends between outer sidewalls of the first magnetic layer.

3. The IC of claim 1, wherein a maximum distance between the opposing sidewalls of the first dielectric layer is less than a minimum width of the second magnetic layer.

4. The IC of claim 1, wherein a distance between the opposing sidewalls continuously increases from a bottom surface of the first dielectric layer to a top surface of the first dielectric layer, wherein a width of the first magnetic layer continuously increases in a direction pointing from the bottom surface to the top surface of the first dielectric layer.

5. The IC of claim 1, wherein a height of the second magnetic layer is less than a height of the first magnetic layer.

6. The IC of claim 5, wherein the height of the second magnetic layer is less than a height of the conductive wires.

7. The IC of claim 1, further comprising:
   a second dielectric layer disposed along an upper surface and sidewalls of the first magnetic layer, wherein the second dielectric layer encloses the conductive wires, and wherein the second dielectric layer comprises a same material as the first dielectric layer.

8. The IC of claim 1, further comprising:
   an etch stop layer extending along a top surface of the first dielectric layer and lining the trench.

9. An integrated circuit (IC) comprising:
   a substrate;
   an interconnect structure having a plurality of metal layers overlying the substrate;
   a passivation layer overlying the interconnect structure;
   a first dielectric layer having slanted opposing sidewalls that define a trench overlying the passivation layer;
   a first etch stop layer extending along a top surface of the first dielectric layer and the slanted opposing sidewalls;
   a first magnetic layer overlying the first etch stop layer and disposed within the trench;
   a first conductive wire and a second conductive wire disposed within the trench and overlying the first magnetic layer, wherein the first and second conductive wires extend in parallel with one another along a first direction parallel to an upper surface of the substrate;
   a second dielectric layer filling the trench and enclosing the first and second conductive wires; and
   a second magnetic layer disposed over the first magnetic layer and the second dielectric layer, wherein the first and second magnetic layers wrap around the first and second conductive wires and laterally extend along a middle segment of the first and second conductive wires in the first direction.

10. The IC of claim 9, further comprising:
    a first input/out (I/O) structure directly contacting and disposed over the first conductive wire, wherein the first I/O structure is laterally offset from a first sidewall of the second magnetic layer in a direction away from the second magnetic layer; and
    a second I/O structure directly contacting and disposed under the first conductive wire, wherein the second I/O structure is disposed within the passivation layer, wherein the second I/O structure is laterally offset from a second sidewall of the second magnetic layer in another direction away from the second magnetic layer, wherein the first sidewall is opposite the second sidewall.

11. The IC of claim 10, wherein a first height defined between a top surface of the first etch stop layer and a top surface of the second magnetic layer is less than half of a second height defined between the top surface of the first etch stop layer and a top surface of the first I/O structure.

12. The IC of claim 9, wherein the first and second magnetic layers comprise Cobalt Zirconium Tantalum (CZT).

13. The IC of claim 9, wherein the slanted opposing sidewalls of the first dielectric layer are spaced laterally between slanted opposing sidewalls of the second magnetic layer, wherein the second magnetic layer has a substantially flat upper surface that continuously extends between the slanted opposing sidewalls of the second magnetic layer.

14. The IC of claim 9, wherein the first and second dielectric layers comprise a polyimide compound or a polybenzoxazole compound.

15. The IC of claim 9, further comprising:
    an isolation layer overlying the first magnetic layer and the second dielectric layer; and
    a second etch stop layer overlying the isolation layer, wherein the isolation layer and the second etch stop layer are sandwiched between the first and second magnetic layers.

16. The IC of claim 9, wherein the first and second conductive wires respectively comprise a protrusion that extends below the first magnetic layer into the passivation layer and is electrically coupled to the metal layers in the interconnect structure.

17. A method for forming an integrated circuit (IC), the method comprising:

- forming an interconnect structure having a plurality of metal layers over a substrate;
- forming a passivation layer over an uppermost surface of the interconnect structure;
- forming a first dielectric layer over the passivation layer, wherein the first dielectric layer has sidewalls defining a trench;
- forming a first magnetic layer over the passivation layer, wherein the first magnetic layer lines the trench and extends over a top surface of the first dielectric layer, wherein forming the first magnetic layer comprises depositing a magnetic material over the first dielectric layer, forming a masking layer over the magnetic material, and performing a wet etch process on the magnetic material to remove unmasked regions of the magnetic material;
- forming conductive wires spaced apart from one another over the first magnetic layer;
- forming a second dielectric layer over the conductive wires, wherein the second dielectric layer at least partially fills the trench; and
- forming a second magnetic layer over the second dielectric layer and the first magnetic layer, wherein the second magnetic layer has a substantially flat upper surface that continuously extends between the sidewalls of the first dielectric layer.

18. The method of claim 17, wherein forming the first dielectric layer comprises:

- depositing a dielectric material over the passivation layer, wherein the dielectric material comprises a polyimide compound or a polybenzoxazole compound;
- patterning the dielectric material to form the sidewalls that define the trench; and
- performing a curing process on the dielectric material.

19. The method of claim 17, wherein forming the conductive wires comprises:

- forming an isolation layer over the first magnetic layer;
- forming a barrier seed layer over the isolation layer;
- forming a photoresist layer over the barrier seed layer, wherein the photoresist layer comprises wire openings; and
- forming the conductive wires in the wire openings, wherein the conductive wires are formed by an electrochemical plating (ECP) process.

20. The method of claim 17, wherein the magnetic material comprises Cobalt Zirconium Tantalum (CZT).

* * * * *